(12) United States Patent
Akram

(10) Patent No.: US 6,893,961 B2
(45) Date of Patent: May 17, 2005

(54) METHODS FOR MAKING METALLIZATION STRUCTURES FOR SEMICONDUCTOR DEVICE INTERCONNECTS

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/829,161

(22) Filed: Apr. 9, 2001

(65) Prior Publication Data

US 2002/0001943 A1 Jan. 3, 2002

Related U.S. Application Data

(62) Division of application No. 09/388,031, filed on Sep. 1, 1999.

(51) Int. Cl.[7] .............................................. H01L 21/44
(52) U.S. Cl. ........................ 438/652; 438/653; 438/685
(58) Field of Search ................................ 438/652–654, 438/685, 669, 679, 680

(56) References Cited

U.S. PATENT DOCUMENTS

| | | | |
|---|---|---|---|
| 4,619,037 A | 10/1986 | Taguchi et al. | 29/578 |
| 4,988,423 A | 1/1991 | Yamamoto et al. | 204/192 |
| 5,275,973 A | 1/1994 | Gelatos | |
| 5,300,813 A | 4/1994 | Joshi et al. | 257/752 |

(Continued)

FOREIGN PATENT DOCUMENTS

JP       01 101 671 A     4/1989

OTHER PUBLICATIONS

Kordic, Srdjan et al., Size and vol. Distributions of Thermally Induced Stress Voids in AlCu Metallization, Appl. Phys. Lett. 68(8), Feb. 19, 1996.

*Primary Examiner*—Ha Tran Nguyen
(74) *Attorney, Agent, or Firm*—TraskBritt

(57) ABSTRACT

The present invention provides a metallization structure for semiconductor device interconnects such as a conductive line, including a substrate with a substantially planar upper surface, foundation metal containing layer disposed on a portion of the substrate upper surface, primary conducting metal containing layer overlying the foundation metal containing layer, and metal containing spacer on the sidewalls of the primary conducting metal containing layer and the foundation metal containing layer. The present invention also provides a metallization structure including a substrate with a foundation metal containing layer disposed thereon, a dielectric layer with an aperture therethrough being disposed on the substrate, where the bottom of the aperture exposes the foundation metal containing layer of the substrate, and a metal. containing spacer on the sidewall of the aperture and a line or plug of a primary conducting metal fill the remaining portion of the aperture. The present invention also includes methods for making the metallization structures.

60 Claims, 7 Drawing Sheets

U.S. PATENT DOCUMENTS

| | | | |
|---|---|---|---|
| 5,317,185 A | 5/1994 | Fernandes et al. | 257/629 |
| 5,321,211 A | 6/1994 | Haslam et al. | |
| 5,335,138 A | 8/1994 | Sandhu et al. | |
| 5,356,659 A | 10/1994 | Seshubabu et al. | 438/625 |
| 5,475,267 A | 12/1995 | Ishii et al. | 257/752 |
| 5,489,548 A | 2/1996 | Nishioka et al. | |
| 5,498,889 A | 3/1996 | Hayden | 257/301 |
| 5,529,954 A | 6/1996 | Iijima et al. | 438/653 |
| 5,534,463 A | 7/1996 | Lee et al. | |
| 5,545,590 A | 8/1996 | Licata | 438/629 |
| 5,578,523 A | 11/1996 | Fiordalice et al. | 438/633 |
| 5,637,527 A | 6/1997 | Baek | |
| 5,701,647 A | 12/1997 | Saenger et al. | 29/25.42 |
| 5,712,195 A | 1/1998 | Chang | 438/623 |
| 5,770,519 A | 6/1998 | Klein et al. | |
| 5,793,057 A | 8/1998 | Summerfelt | 257/55 |
| 5,808,365 A | 9/1998 | Mori | 257/775 |
| 5,825,609 A | 10/1998 | Andricacos et al. | 361/321.4 |
| 5,879,957 A | 3/1999 | Joo | 438/3 |
| 5,903,053 A | 5/1999 | Iijima et al. | |
| 5,913,143 A | 6/1999 | Harakawa | |
| 5,917,244 A | 6/1999 | Lee et al. | |
| 5,937,319 A | 8/1999 | Xiang et al. | 438/585 |
| 5,960,282 A | 9/1999 | Chuang | 438/255 |
| 5,985,762 A | 11/1999 | Geffken et al. | |
| 6,020,233 A * | 2/2000 | Kim | |
| 6,030,896 A | 2/2000 | Brown | |
| 6,046,502 A | 4/2000 | Matsuno | 257/751 |
| 6,054,380 A | 4/2000 | Naik | |
| 6,060,377 A | 5/2000 | Xiang et al. | |
| 6,071,787 A | 6/2000 | Joo | 438/369 |
| 6,074,943 A | 6/2000 | Brennan et al. | |
| 6,133,635 A | 10/2000 | Bothra et al. | |
| 6,153,900 A | 11/2000 | Chang et al. | 257/301 |
| 6,166,439 A | 12/2000 | Cox | 257/758 |
| 6,180,517 B1 | 1/2001 | Liou et al. | 438/639 |
| 6,197,682 B1 | 3/2001 | Drynan et al. | 438/639 |
| 6,235,626 B1 | 5/2001 | Makino et al. | |
| 6,242,340 B1 | 6/2001 | Lee | |
| 6,255,734 B1 | 7/2001 | Liu et al. | |
| 6,277,745 B1 | 8/2001 | Liu et al. | 438/687 |
| 6,281,115 B1 | 8/2001 | Chang et al. | |
| 6,285,082 B1 | 9/2001 | Joshi et al. | |
| 6,307,266 B1 | 10/2001 | Yung | |
| 6,384,438 B2 | 5/2002 | Cho et al. | |
| 6,420,725 B1 | 7/2002 | Harshfield | |
| 6,436,816 B1 | 8/2002 | Lee et al. | |
| 6,646,340 B2 | 11/2003 | Deeter et al. | |
| 6,677,647 B1 | 1/2004 | Dawson | |
| 2001/0044202 A1 | 11/2001 | Huang et al. | |

* cited by examiner

METHODS FOR MAKING METALLIZATION STRUCTURES FOR SEMICONDUCTOR DEVICE INTERCONNECTS

CROSS-REFERENCE TO RELATED APPLICATION

This application is a divisional of application Ser. No. 09/388,031, filed Sep. 1, 1999, pending.

BACKGROUND OF THE INVENTION

Field of the Invention: This invention relates generally to the field of semiconductor device design and fabrication. Specifically, the invention relates to methods for manufacturing metallization structures in integrated circuit devices and the resulting structures.

State of the Art: Integrated circuits (ICs) contain numerous individual devices, such as transistors and capacitors, that are interconnected by an intricate network of horizontal and vertical conductive lines commonly termed "interconnects." Exemplary interconnect structures are disclosed in U.S. Pat. Nos. 5,545,590, 5,529,954, 5,300,813, 4,988,423, and 5,356,659, each of which patents is hereby incorporated herein by reference.

Aluminum interconnect structures are decreasing in size and pitch (spacing), as the industry trend continues toward, and includes, submicron features and pitches. The resultant reduction in structure sizes leads to numerous reliability concerns, including electromigration and stress voiding of the interconnect structures.

Stress notches (also known as stress voids) on the surface of conductive interconnect structures are of concern because the voids or notches degrade reliability and device performance. Stress notches, when formed in a conductive line, may render the line substantially discontinuous and unable to effectively transmit a signal. Stress notches at a grain boundary are extremely detrimental, as they may propagate along the boundary and sever the conductive line completely.

Stress notches are also undesirable because they can alter the resistivity of a conductive line and change the speed at which signals are transmitted. Resistivity changes from stress notching are especially important as line dimensions shrink, because notching in a submicron conductive line alters resistivity more than notching in a larger line with its consequently greater cross-sectional area. Thus, the ever more stringent pitch sizing and higher aspect ratios (height to width of the structure or feature) sought by practitioners in the art have imitated considerable stress voiding concerns.

It is believed that stress notching results from both structural and thermal stresses between conductive lines and adjacent insulating and passivation layers. Kordic et al., *Size and Volume Distributions of Thermally Induced Stress Voids in AlCu Metallization*, Appl. Phys. Lett., Vol. 68, No. 8, 19 Feb. 1996, pp. 1060–1062, incorporated herein by reference, describes how stress voids begin at the edge of a conductive line where the density of the grain boundaries is largest. As illustrated in FIG. 12 herein, stress notches form at the exterior surfaces and surface intersections of the conductive lines in order to relieve areas of high stress concentration. The notches may then propagate into, and across, the interior of the conductive line until the line becomes disrupted, cracked, and/or discontinuous.

Aluminum (Al) and Al alloy (such as Al/Cu) lines are especially susceptible to stress notching because of both the thermal expansion mismatch between Al and adjacent layers and the relatively low melting point of Al. As the temperature changes, stresses are induced in Al or Al alloy lines because aluminum's coefficient of thermal expansion (CTE) differs from the CTE of the materials comprising the adjacent layers. To relieve these stresses, Al atoms migrate and form stress notches. Further, because Al has a low melting point, Al atoms migrate easily at low temperatures and aggravate a tendency toward stress notch formation.

Several methods have been proposed to reduce stress notching. One proposed method uses a material less susceptible to stress notching, such as copper (Cu) or tungsten (W), in the conductive line. Using Cu in conductive lines, however, has in the past resulted in several problems. First, copper is difficult to etch. Second, adhesion between copper and adjacent insulating layers is poor and thus poses reliability concerns. Third, adding Cu to Al lines may reduce stress notching, but beyond a certain Cu concentration, device performance may begin to degrade. Fourth, as conductive line geometries shrink, adding Cu to Al lines seems less effective in reducing stress notching. Finally, even using Cu interconnects in the manner employed in the prior art can still lead to notching effects, especially at 0.1 $\mu$m geometries and below since, at such dimensions, line widths have become so small that any imperfection can cause openings. Using W in Al conducting lines is also undesirable—W has a high resistivity and, therefore, reduces signal speed.

Another proposed method to reduce stress notching modifies how the layers adjacent conductive lines (e.g., insulating and passivation layers) are formed. This method has focused, without notable success, on the rate, temperature, and/or pressure at which the adjacent layers are deposited, as well as the chemical composition of such layers.

Yet another proposed method to reduce stress notching comprises forming a cap on the conductive lines. Such caps can be formed from TiN, W, or Ti—W compounds. These materials have higher melting points than Al and, therefore, have a higher resistance to stress notching. A disadvantage in using such caps, however, is that additional process steps, such as masking steps, are required.

U.S. Pat. No. 5,317,185, incorporated herein by reference, describes still another proposed method for reducing stress notching. This patent discloses an IC device having a plurality of conductive lines where the outermost conductive line is a stress-reducing line. This stress-reducing line is a nonactive structure which reduces stress concentrations in the inner conductive lines.

BRIEF SUMMARY OF THE INVENTION

The present invention relates to a metallization structure for semiconductor device interconnects comprising a substrate having a substantially planar upper surface, a metal containing layer disposed on a portion of the substrate upper surface, a conducting layer overlying the metal containing layer, and metal containing spacers flanking the sidewalls of the conducting layer and the underlying metal containing layer. The metal containing layer and metal containing spacers do not encapsulate the conducting layer. The substrate upper surface is preferably a dielectric layer. The conducting layer preferably comprises aluminum or an aluminum-copper alloy, but may also comprise copper. When the conducting layer comprises Al, the metal containing layer and metal containing spacer preferably comprise titanium, such as Ti or TiN. An optional dielectric layer, preferably silicon oxide, may be disposed on the conducting layer. When the optional dielectric layer is present, the metal containing spacer extends along the sidewall of the dielectric layer.

The present invention also relates to a metallization structure comprising a substrate having a metal containing layer disposed thereon, a dielectric layer having an aperture therethrough disposed on the substrate so the bottom of the aperture exposes the upper surface of the metal containing layer, at least one metal containing spacer on the sidewall of the aperture, and a conducting layer filling the remaining portion of the aperture. The metal containing layer and metal containing spacer preferably comprise titanium, such as Ti or TiN. At least one upper metal containing layer may be disposed on the conducting layer.

The present invention further relates to a method for making a metallization structure by forming a substantially planar first dielectric layer on a substrate, forming a metal containing layer over the first dielectric layer, forming a conducting layer over the metal containing layer, forming a second dielectric layer over the conducting layer, removing a portion of the second dielectric layer, conducting layer, and metal containing layer to form a multi-layer structure, and forming metal containing spacers on the sidewalls of the multi-layer structure. The process optionally removes both the second dielectric layer portion of the multi-layer structure and the laterally adjacent portions of the metal containing spacers.

The present invention additionally relates to a method for making a metallization structure by forming a substrate comprising a metal containing layer disposed thereon, forming a dielectric layer comprising an aperture on the substrate so the bottom of the aperture exposes the upper surface of the metal containing layer, forming a metal containing spacer on the sidewall (in the case of a via) or sidewalls (in the case of a trench) of the aperture, and forming a conducting layer in the remaining portion of the aperture. At least one upper metal containing layer may optionally be formed on the conducting layer.

The present invention also relates to a method for making a metallization structure by forming a substrate comprising a metal containing layer on the surface thereof, forming on the substrate a dielectric layer comprising an aperture so the bottom of the aperture exposes the surface of the metal containing layer, forming a conducting layer in the aperture, forming an upper metal containing layer overlying the dielectric layer and the aperture, removing the portions of the upper metal containing layer overlying the dielectric layer, removing the dielectric layer, removing the portions of the metal containing layer not underlying the aperture to form a multi-layer metal containing structure, and forming a metal spacer on the sidewall or sidewalls of the multi-layer metal containing structure.

The present invention provides several advantages when compared to the prior art. One advantage is that thermally induced stress voids are reduced because the metal containing layer and metal containing spacer comprise materials exhibiting good thermal-voiding avoidance characteristics. Another advantage is that the size of conductive lines can be shrunk further in comparison to dimensions achievable by conventional processes, since only one additional deposition and etch step, without an additional masking step, is needed to form the metallization structure. Shrinking of conductive lines is necessary as device geometries decrease to less than 0.1 $\mu$m. At these small geometries, even small notches can significantly decrease conductivity.

The invention also specifically includes semiconductor devices including the inventive metallization structures.

BRIEF DESCRIPTION OF THE SEVERAL VIEWS OF THE DRAWINGS

The present invention, in part, is illustrated by the accompanying drawings in which.

DETAILED DESCRIPTION OF THE INVENTION

Generally, the present invention relates to a metallization structure for interconnects and semiconductor devices including same. Specifically, the present invention reduces strss voiding, especially thermally induced stress voiding, in conducting lines. The metallization structures described below exemplify the present invention without reference to a specific device because the inventive process and structure can be modified by one of ordinary skill in the art for any desired device.

The following description provides specific details, such as material thicknesses and types, in order to provide a thorough description of the present invention. The skilled artisan, however, would understand that the present invention may be practiced without employing these specific details. Indeed, the present invention can be practiced in conjunction with conventional fabrication techniques employed in the industry.

The process steps described below do not form a complete process flow for manufacturing IC devices. Further, the metallization structures described below do not form a complete IC device. Only the process steps and structures necessary to understand the present invention are subscribed below.

Figure 1:
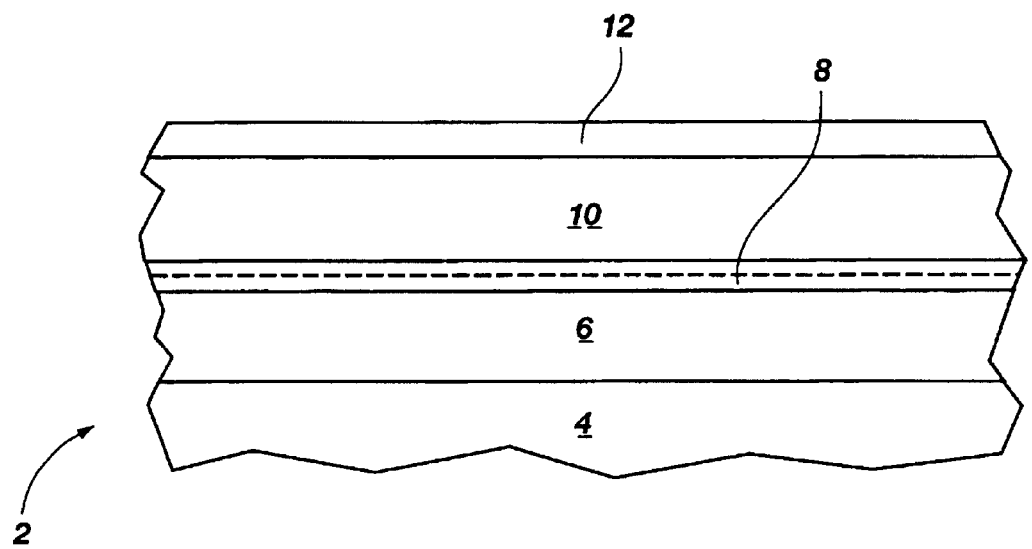
FIGS. 1, 2, 3a, and 3b illustrate cross-sectional views of one process of forming a metallization structure, and the structure formed thereby, according to the invention.

One embodiment of a process and resulting metallization structure of the present invention is illustrated in FIGS. 1, 2, 3a, and 3b. This embodiment may be characterized as a predominaly "subtractive" process, in comparison to the second embodiment discussed hereinafter, in that portions of superimposed material layers are removed to define the intrconnect structure features, such as lines. As shown in FIG. 1, a portion of semiconductor device 2 includes substrate 4 with overlying first dielectric layer 6. Substrate 4 may be any surface suitable for integrated circuit device formation, such as a silicon or other semiconductor wafer or other substrate, and may be doped and/or include an epitaxial layer. Substrate 4 may also be an intermediate layer in a semiconductor device, such as a metal containing contact layer or an interlevel dielectric layer. Preferably, substrate 4 is a silicon wafer or bulk silicon region, such as a silicon-on-insulator (SOI) or silicon-on-sapphire (SOS) structure.

First dielectric layer 6 may comprise any dielectric material used in IC device fabrication. Examples of such dielectric materials include silicon oxide, silicon nitride, silicon oxynitride, silicon oxide containing dopants such as boron (B) or phosphorus (P), organic dielectrics, or a layered dielectric film of these materials. Preferably, first dielectric layer 6 is silicon oxide or borophosphosilicate glass (BPSG).

First dielectric layer 6 may be formed by any process yielding the desired physical and chemical characteristics, such as thermal oxidation, thermal nitridation, or vapor deposition.

Overlying first dielectric layer 6 is metal containing layer 8. One or more individual metal containing layers may be used as metal containing layer 8. For example, if two superimposed metal containing layers are employed (represented by the dashed line in metal containing layer 8), an adhesion-promoting metal containing layer can be a first, lower portion of metal containing layer 8 on first dielectric layer 6 and a stress-reducing layer can be a second, upper portion of metal containing layer 8. Other metal containing layers might be included for other functions, such as a layer for reducing electromigration. Preferably, a single metal containing layer is used as metal containing layer 8, especially when the single layer can reduce electromigration, function as an adhesion- promoting layer, and function as a stress-reducing layer. If two metal containing layers are employed, the first, upper metal containing layer may, for example, comprise tantalum, titanium, tungsten, TaN, or TiN and the second, lower metal containing layer overlying first dielectric layer 6 may, for example, comprise TiN, TiW, WN, or TaN.

Metal containing layer 8 includes not only metals, but their alloys and compounds (e.g., nitrides and silicides). For example, a metal containing layer containing titanium might also contain nitrogen or silicon, such as titanium nitride or titanium silicide. Any metal, metal alloy, or metal compound can be employed in metal containing layer 8, provided it exhibits the characteristics described above, either alone or when combined with other metal containing layers. Examples of metals that can be employed in metal containing layer 8 include cobalt (Co), Ti, W, Ta, molybdenum (Mo), and alloys and compounds thereof, such as TiW or TiN. Preferably, metal containing layer 8 comprises titanium. Titanium is a good adhesion layer and serves as a stress-reducing layer since Ti exhibits good thermal voiding resistance characteristics.

Metal containing layer 8 is deposited or otherwise formed by any process used in IC device fabrication. For example, metal containing layer 8 may be deposited by chemical vapor deposition (CVD) or physical vapor deposition (PVD) techniques, depending on the characteristics required of the layer. As used herein, the term "CVD techniques" encompasses, without limitation, plasma-enhanced CVD, or PECVD. Preferably, when metal containing layer 8 is Ti, this layer is formed by sputtering (a form of PVD) a film of Ti. If metal containing layer 8 is a metal nitride, it may be formed, for example, by depositing the metal in a nitrogen-containing atmosphere or by depositing the metal and annealing in a nitrogen-containing atmosphere. If metal containing layer 8 is a metal silicide, it may be formed, for example, by first depositing either the metal containing layer or a silicon layer, then depositing the other, and heating to react the two layers and form the silicide. If metal containing layer 8 is a metal alloy, it may be formed by any process suitable for depositing the metal alloy. For example, either sputtering or CVD techniques can be employed.

Conducting layer 10 is then formed over metal containing layer 8. Conducting layer 10 may comprise any conducting material used in IC device fabrication. Preferably, conducting layer 10 comprises a conducting metal, such as Al, optionally containing other elements such as Si, W, Ti, and/or Cu. More preferably, conducting layer 10 is an aluminum-copper alloy. Conducting layer 10 may also be formed of Cu. Conducting layer 10 may be formed by any method used in IC device fabrication such as CVD or PVD techniques. Preferably, conducting layer 10 is deposited by a PVD method such as sputtering, as known in the art. Second dielectric layer 12 is next deposited or otherwise formed on top of conducting layer 10. Second dielectric layer 12 comprises any dielectric material used in IC device fabrication, including those listed above. Preferably, second dielectric layer 12 comprises a material that serves as an etch stop, as explained below. More preferably, second dielectric layer 12 comprises fluorine-doped silicon oxide or other low dielectric constant material. Second dielectric layer 12 may be formed by any suitable process giving the desired physical and chemical characteristics, such as CVD, PECVD (plasma enhanced chemical vapor deposition), spin-on methods, or otherwise, depending upon the dielectric material selected. For use of the preferred fluorine-doped silicon oxide, the preferred deposition method is PECVD.

Figure 2:
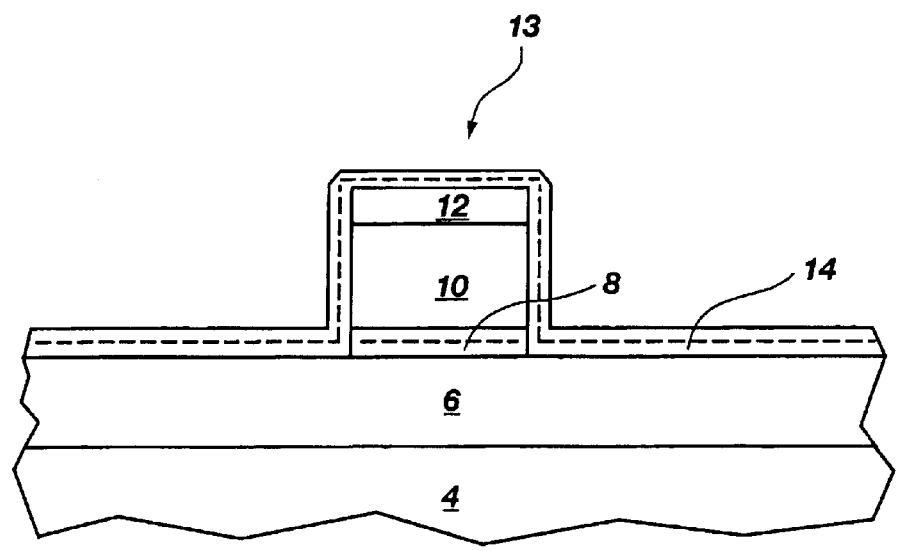

As shown in FIG. 2, portions of second dielectric layer 12, conducting layer 10, and metal containing layer 8 have been removed, forming multi-layer structure 13. The portions of layers 8, 10 and 12 are removed by any IC device fabrication process, such as a photolithographic patterning and dry etching process. The resulting multi-layer structure forms the basis for an interconnect structure according to the present invention. Of course, the patterning and etch process would normally be performed to define a large number of interconnect structures, such as conductive lines 100 (see FIGS. 3a and 3b) extending across substrate 4.

As also shown in FIG. 2, second metal containing layer 14 (also termed a metal containing spacer layer) is then deposited on first dielectric layer 6 and over multi-layer structure 13. In similar fashion to the structure of metal containing layer 8, one or more individual metal containing layers, illustrated by the dashed line within second metal containing layer 14, may be used as second metal containing layer 14. Preferably, a single metal containing layer is used as second metal containing layer 14 for the same reasons as those set forth for metal containing layer 8.

Like metal containing layer 8, second metal containing layer 14 includes not only metals but their alloys and compounds (e.g., nitrides and silicides). Preferably, when conducting layer 10 comprises aluminum, second metal containing layer 14 comprises Ti. If conducting layer 10 comprises Cu, second metal containing layer 14 preferably comprises TiW. More preferably, second metal containing layer 14 comprises the same metal as metal containing layer 8. Second metal containing layer 14 may be deposited or otherwise formed by a process similar to the process used to form metal containing layer 8. Preferably, second metal containing layer 14 is formed by a conformal deposition process, such as CVD.

Figure 3A:
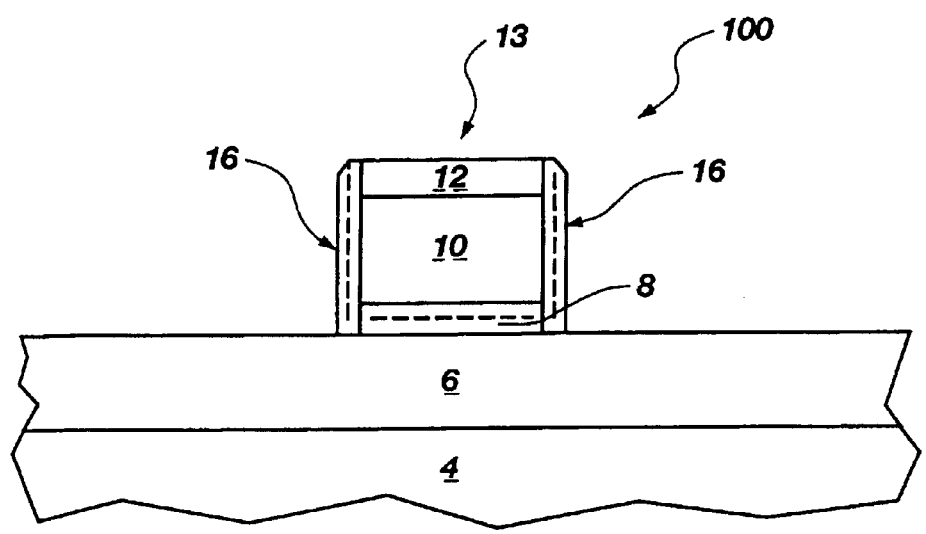

Next, as illustrated in FIG. 3a, second metal containing layer 14 is spacer etched to remove portions of the second metal containing layer 14 on first dielectric layer 6 and on second dielectric layer 12, thereby leaving metal containing spacers 16 on the multi-layer structure 13. A spacer etch is a directional sputtering etch which removes second metal containing layer 14 so that metal containing spacers 16 remain on the sidewalls of multi-layer structure 13. The spacer etch uses the first and second dielectric layers as an etch stop.

If desired, second dielectric layer 12 can then be removed. Second dielectric layer 12 can be removed by any process which removes the second dielectric layer without removing first dielectric layer 6. If the first and second dielectric layers comprise different materials (e.g., when second dielectric layer 12 is silicon oxide and the first dielectric layer 6 is BPSG), any process which selectively etches the second dielectric layer 12 can be employed. The etch process would also remove the portions of metal containing spacers 16 laterally adjacent dielectric layer 12, thus resulting in the metallization structure illustrated in FIG. 3b. When the first and second dielectric layers 6, 12 are similar or have similar etch rates (e.g., when both are silicon oxide or fluorine-doped), a facet etch process can be used. As shown in broken lines in FIG. 3b, when the first and second dielectric layers 6 and 12 exhibit similar etch rates, the thickness of layer 6 will be reduced by substantially the thickness of removed layer 12.

Figure 3B:
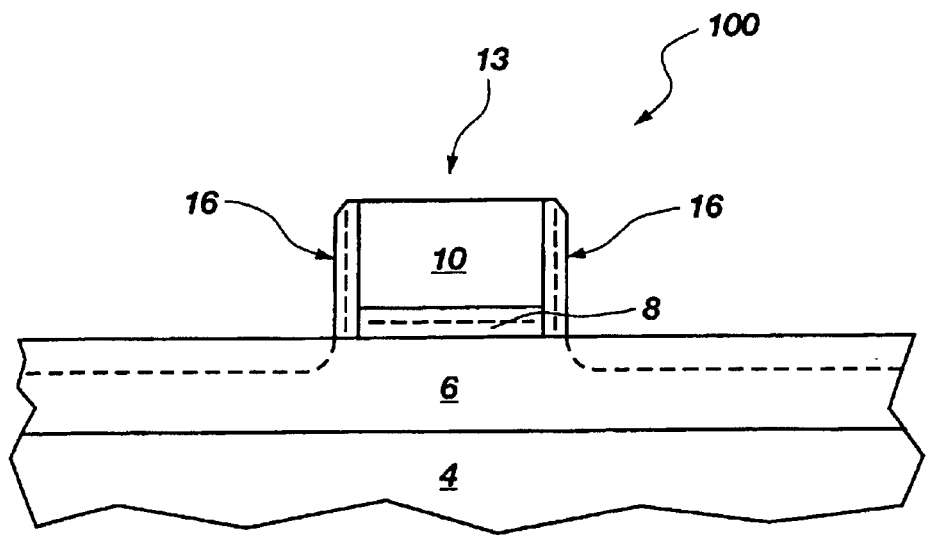

The metallization structures illustrated in FIGS. 3a and 3b reduce thermally induced stress voids in conductive lines 100. Metal containing layer 8 and metal containing spacers 16 serve as a protective coating at the respective lower and lateral surfaces of conductive lines 100 and at intersections thereof, thereby reducing the incidence of stress voids by preventing them from starting at these surfaces and intersections thereof on conductive line 100. Metal containing layer 8 and metal containing spacers 16 also increase reliability of conductive line 100 without reducing its resistance.

The metallization structures of FIGS. 3a and 3b can then be processed as desired to complete the IC device. For example, an interlevel dielectric layer could be deposited thereover, contact or via holes could be cut in the interlevel dielectric, a patterned metal containing layer could be formed to achieve a desired electrical interconnection pattern, and a protective dielectric overcoat deposited and patterned to expose desired bond pads.

Figure 4:
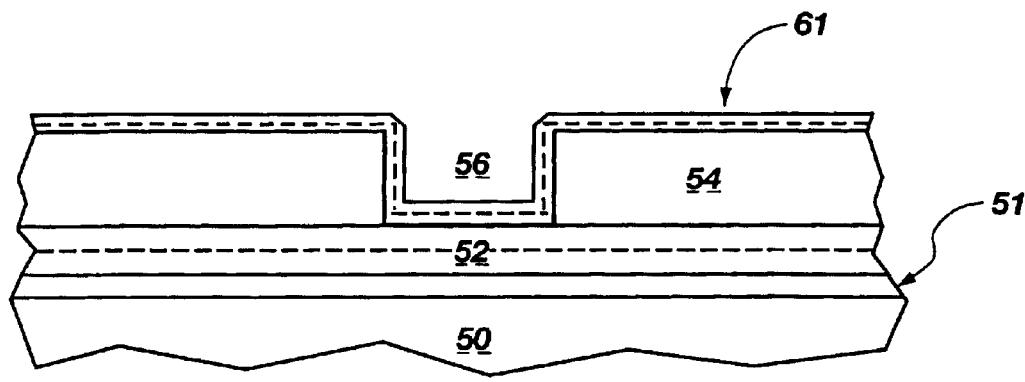
FIGS. 4, 5, 6, 7a, and 7b illustrate cross-sectional views of another process of forming a metallization structure, and the structure formed thereby, according to the invention.

Another embodiment of a process and resulting metallization structures of the present invention is represented in FIGS. 4 through 11. This embodiment may be characterized as more of an "additive" method or process than that described with respect to FIGS. 1 through 3b, in that metallization structures for interconnects are formed by deposition in apertures, such as vias or trenches. As such, it should be noted that cusping of material deposited to line the sidewall or sidewalls of an aperture may be of concern if the method of deposition is not sufficiently anisotropic or, in some instances, the aperture exhibits a very high aspect ratio. In FIG. 4, metal containing layer 52 has been deposited or otherwise formed over substrate 50. Any of the substrates employable as substrate 4 above can be used as substrate 50. Preferably, substrate 50 is a silicon wafer or bulk silicon region, such as an SOI or SOS structure. Such substrate 50 can have active and passive devices and other electrical circuitry fabricated on it, these circuit structures being interconnected by the metallization structures of the present invention. Therefore, a direct electrical path may exist between the devices and circuitry of the substrate 50 (or 4), the devices and circuitry being omitted herein for simplicity.

Metal containing layer 52 may comprise a discrete conductive member, such as a wire, a stud, or a contact. Preferably, metal containing layer 52 is substantially similar to metal containing layer 8 described above and may be of any of the same metals, alloys or compounds. If desired, a dielectric layer 51 can be formed on substrate 50 and beneath metal containing layer 52. Dielectric layer 51 is substantially similar to first dielectric layer 6 described above.

As illustrated in FIG. 4, dielectric layer 54 is then deposited or otherwise formed on metal containing layer 52.

Dielectric layer 54 may be any dielectric or insulating material used in IC device fabrication, such as those listed above for second dielectric layer 12. Preferably, dielectric layer 54 is silicon oxide or spin-on glass (SOG). Dielectric layer 54 may be formed by any IC device fabrication process giving the desired physical and chemical characteristics.

An aperture 56 such as a via or trench is then formed in dielectric layer 54 by removing a portion of dielectric layer 54 to expose underlying metal containing layer 52. Aperture 56 may be formed by any IC device manufacturing method, such as a photolithographic patterning and etching process.

Figure 5:
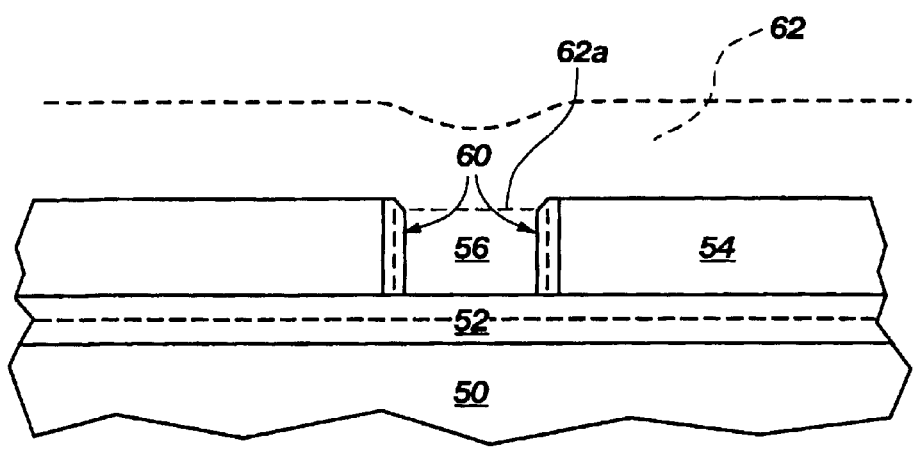

As shown in FIG. 5, metal containing collar 60 is formed on the sidewalls of aperture 56, using a spacer etch as known in the art. It will be understood that the term "collar" encompasses a co-parallel spacer structure 60 if aperture 56 is a trench extending over substrate 50. Similar to second metal containing layer 14, collar 60 may contain one or more metal containing layers with a single metal containing layer preferably used. Also in similar fashion to second metal containing layer 14, collar 60 may include not only metals, but their alloys and compounds. Like second metal containing layer 14, any metal can be employed in collar 60, provided it exhibits the desired characteristics, either alone or when combined with other metal containing layers, and the metals applicable to metal containing layer 14 are equally applicable to collar 60. Preferably, collar 60 comprises the same metal as metal containing layer 52. More preferably, when metal containing layer 52 comprises Al, collar 60 comprises Ti.

Collar 60 is formed by an IC device fabrication process which does not degrade metal containing layer 52, yet forms a collar or spacer-like structures 60 on the sidewall or sidewalls of aperture 56. For example, layer 61 (shown in FIG. 4) of a material from which collar 60 is formed can be conformally deposited on dielectric layer 54 and the walls of aperture 56. Conformal coverage yields a substantially vertical sidewall in the dielectric aperture. While not preferred, a partially conformal layer of the material can be deposited instead. A highly conformal process is preferably employed to form layer 61. Portions of layer 61 on the bottom of aperture 56 and top of dielectric layer 54 are then removed, preferably by using an appropriate directional etch, such as reactive ion etching (RIE).

Figure 6:
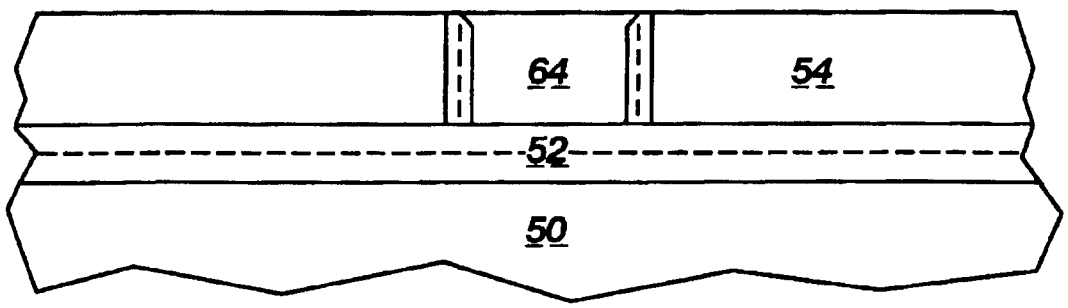

Conducting layer 62 is next deposited or otherwise formed to fill aperture 56 and extend over dielectric layer 54, as shown in broken lines in FIG. 5. Conducting layer 62 may be deposited by any IC device fabrication method yielding the desired characteristics. For example, conducting layer 62 may be deposited by a conformal or non-conformal deposition process. An abrasive planarization process, such as chemical-mechanical planarization (CMP), is then used to remove portions above the horizontal plane of the upper surface of dielectric layer 54 and leave conductive plug (in a via 56) or line (in a trench 56) 64 as illustrated in FIG. 6.

Similar to conducting layer 10, conducting layer 62 comprises any conducting material used in IC devices. Preferably, conducting layer 62 comprises aluminum, optionally containing other metals such as Si, W, Ti, and/or Cu. More preferably, conducting layer 62 is an aluminum-copper alloy. Conducting layer 62 may also comprise copper metal.

Figure 7A:
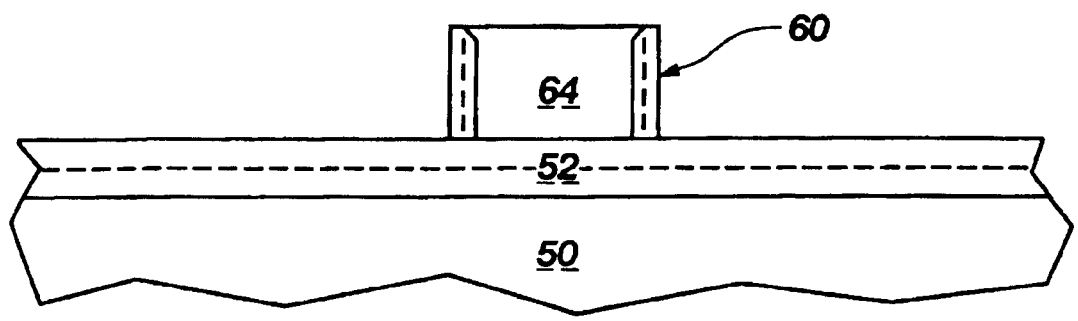
Figure 7B:
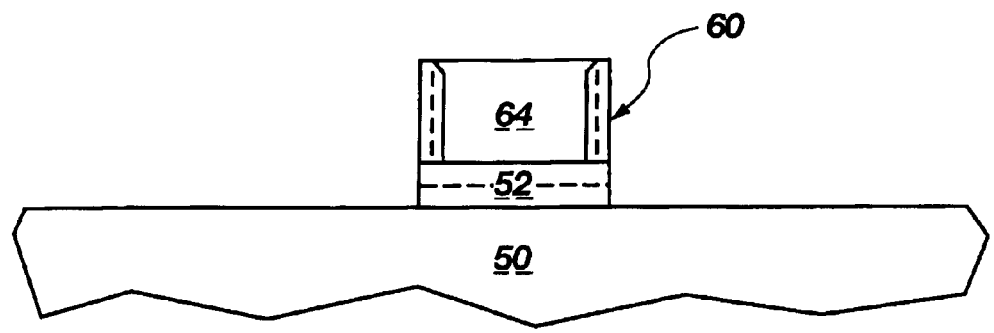

Dielectric layer 54 can then be optionally removed, thus forming the interconnect structure represented in FIG. 7a. Dielectric layer 54 can be removed by any process which does not degrade any of metal containing layer 52, conducting layer 62, or collar 60. For example, when dielectric layer 54 is silicon oxide, it may be removed by an HF wet etch solution or an oxide dry etch process. If desired, portions of metal containing layer 52 can then be removed, preferably by a directional etching process, to obtain the interconnect structure shown in FIG. 7b.

Figure 8:
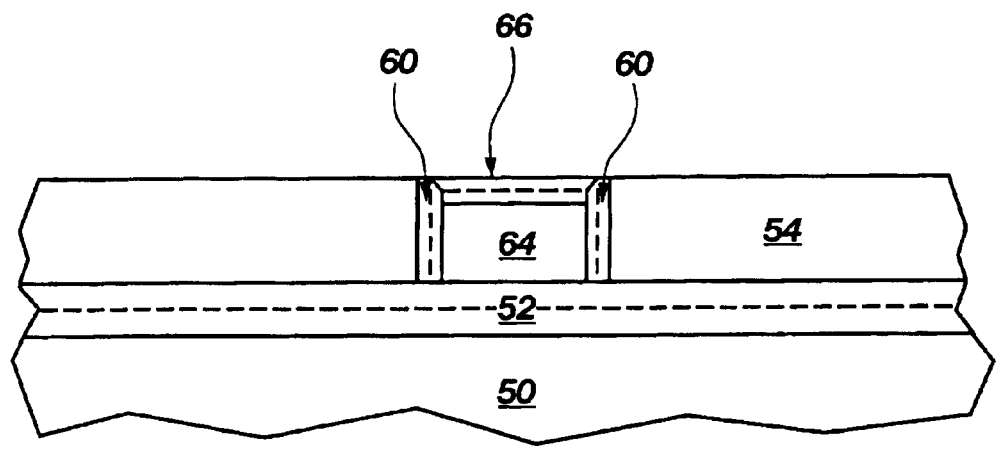
FIGS. 8 and 9 illustrate cross-sectional views of yet another process of forming a metallization structure, and the structure formed thereby, according to the invention.
Figure 9:
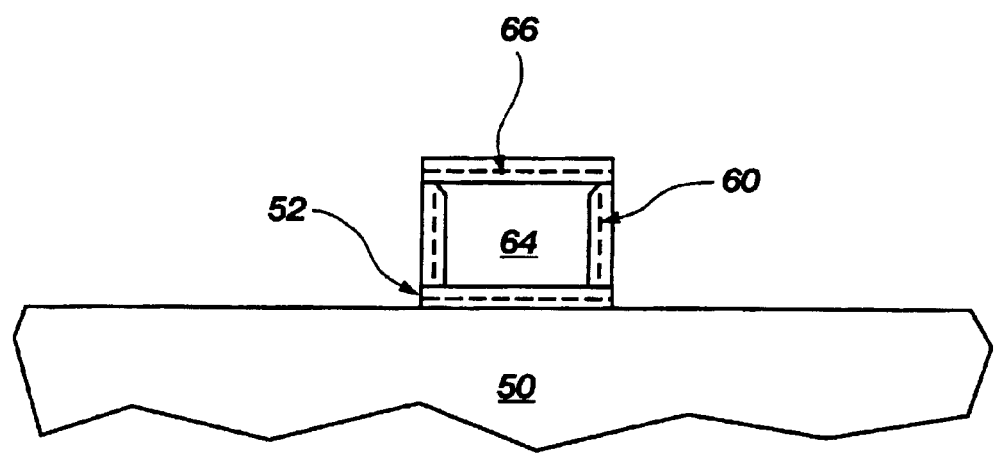
Figure 10:
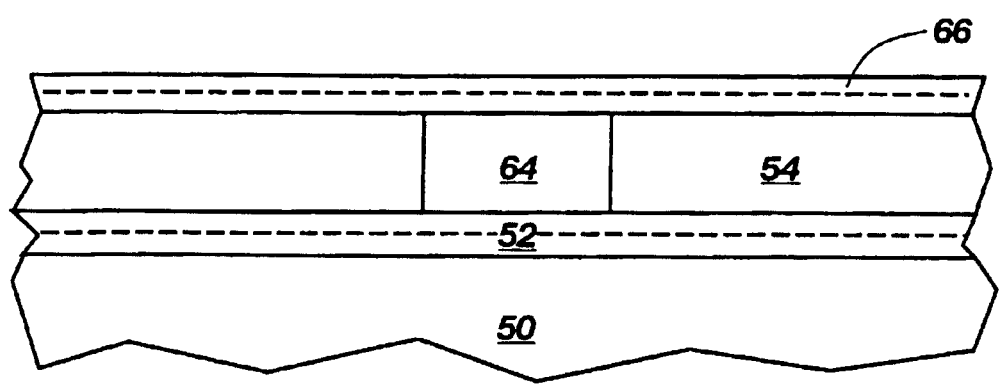
FIGS. 10 and 11 illustrate cross-sectional views of still another process of forming a metallization structure, and the structure formed thereby, according to the invention.
Figure 11:
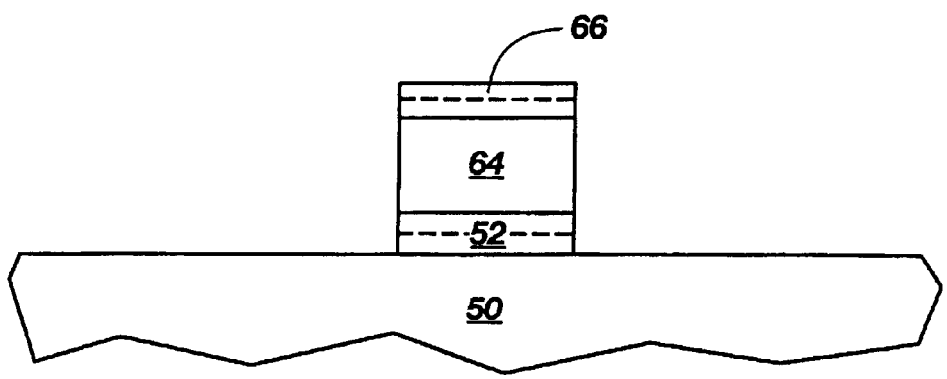
Figure 12:
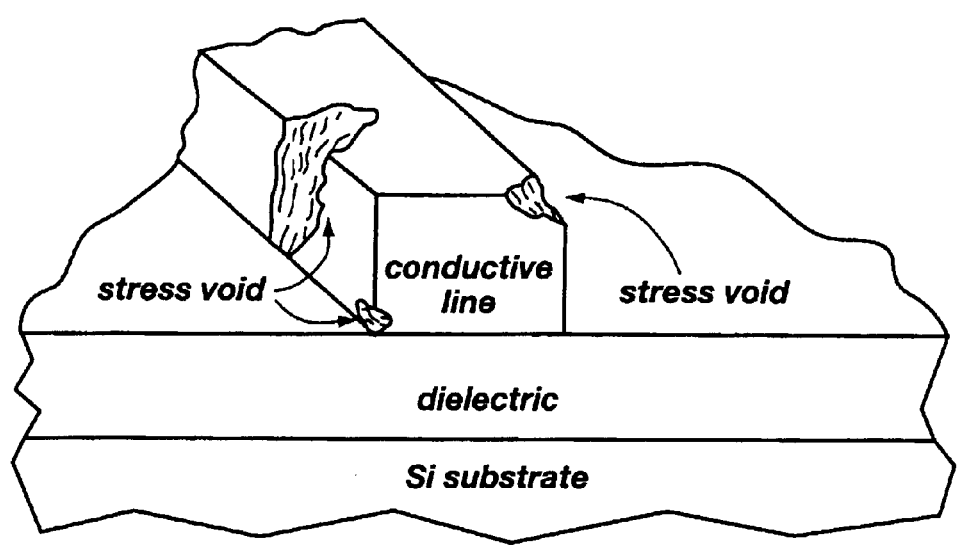
FIG. 12 illustrates a partial cross-sectional, perspective view of a conventional, prior art metallization structure exhibiting stress voids or notches.

In an alternative method, upper metal containing layer 66 can be formed over conductive plug or line 64 as depicted in FIG. 8. Like metal containing layer 52, upper metal containing layer 66 may contain one or more individual metal containing layers. Preferably, a single metal containing layer is used as upper metal containing layer 66. Similar to metal containing layer 52, upper metal containing layer 66 may contain not only metals but their alloys and compounds. Preferably, upper metal containing layer 66 comprises the same material as collar 60. More preferably, when conductive plug 64 comprises Al, upper metal containing layer 66 comprises Ti.

Upper metal containing layer 66 can be formed over conductive plug 64 in the following manner. Conducting layer 62 is deposited in aperture 56 and over dielectric layer 54 as described above with respect to FIG. 5. Prior to completely filling aperture 56, however, the deposition of conducting layer 62 is halted as shown at 62a in FIG. 5, leaving an upper portion of aperture 56 empty (i.e., a recess is left at the top of aperture 56). Upper metal containing layer 66 is then deposited over conducting layer 62, including the still-empty upper portion of aperture 56. Portions of conducting layer 62 and upper metal containing layer 66 above the horizontal plane of dielectric layer 54 are then removed by a planarization process, such as CMP, to form a completely enveloped, or clad, interconnect structure. If desired, portions of dielectric layer 54 and metal containing layer 52 flanking the interconnect structure can be removed as described above to form the structure of FIG. 9.

In another process variant, after forming metal containing layer 52 on substrate 50 and forming dielectric layer 54 with aperture 56 therethrough, but prior to forming collar 60, conductive plug or line 64 could be formed in aperture 56 as described above. Upper metal containing layer 66 could then be deposited, as described above, over conductive plug or line 64 and dielectric layer 54 to obtain the structure illustrated in FIG. 10. Portions of upper metal containing layer 66 not overlying conductive plug or line 64 could then be removed by a photolithographic pattern and etch process, followed by removing dielectric layer 54 by the method described above, to obtain the structure illustrated in FIG. 11. As explained above, the structure of FIG. 11 could then have a conformed metal containing layer deposited and etched (similar to the deposition and etch of second metal containing layer 14 above) to form a structure similar to that depicted in FIG. 3a.

While the preferred embodiments of the present invention have been described above, the invention defined by the appended claims is not to be limited by particular details set forth in the above description, as many apparent variations thereof are possible without departing from the spirit or scope thereof.

What is claimed is:

1. A method for making a metallization structure for a semiconductor device, comprising:

forming a substantially planar first dielectric layer on a substrate;

forming at least one metal containing barrier layer over the first dielectric layer;

forming a homogenous conducting layer directly on the at least one metal containing barrier layer;

forming a second dielectric layer in contact with the homogenous conducting layer;

removing aligned portions of the second dielectric layer, homogenous conducting layer, and at least one metal containing barrier layer to form a multilayer structure; and forming metal containing spacers on sidewalls of the multilayer structure, said metal containing spacers beginning at a lower surface of said at least one metal containing barrier layer and extending substantially to an upper surface of said second dielectric layer.

2. The method of claim 1, wherein said forming the first dielectric layer comprises forming a silicon oxide or BPSG layer.

3. The method of claim 2, wherein said forming the at least one metal containing barrier layer comprises forming the at least one metal containing barrier layer of Ti, Ta, W, Co or Mo or an alloy or a compound of any thereof, including TaN or TiN.

4. The method of claim 3, further comprising forming a second metal containing barrier layer between a first metal containing barrier layer of said at least one metal containing barrier layer and the substrate, said second metal containing barrier layer comprising TiN, TiW, WN, or TaN.

5. The method of claim 1, wherein said forming the at least one metal containing barrier layer comprises forming the at least one metal containing barrier layer of titanium or titanium nitride.

6. The method of claim 1, wherein the at least one metal containing barrier layer is a single metal containing barrier layer and further comprising forming the single metal containing barrier layer of titanium or titanium nitride.

7. The method of claim 1, wherein said forming the homogenous conducting layer comprises forming the homogenous conducting layer from at least one of aluninum and copper.

8. The method of claim 7, wherein said forming the homogenous conducting layer comprises forming the homogenous conducting layer of an aluminum-copper alloy.

9. The method of claim 1, wherein said forming the metal containing spacers comprises forming at least one layer of Ti, Ta, W, Co or Mo, or alloys thereof or compounds thereof, including TaN and TiN.

10. The method of claim 9, wherein said forming the metal containing spacers comprises forming the metal containing spacers of titanium or titanium nitride.

11. The method of claim 1, wherein said forming a second dielectric layer comprises forming the second dielectric layer on the homogenous conducting layer to have sidewalls aligned with sidewalls of the homogenous conducting layer, and forming the metal containing spacers to extend along the sidewalls of the second dielectric layer.

12. The method of claim 11, further comprising forming the second dielectric layer of a low dielectric constant material.

13. The method of claim 12, further comprising forming the second dielectric layer of a fluorine-doped silicon oxide.

14. The method of claim 1, further comprising forming the at least one metal containing barrier layer and the metal containing spacers of a same metal.

15. The method of claim 1, wherein said forming the at least one metal containing barrier layer comprises forming the at least one metal containing barrier layer by vapor deposition.

16. The method of claim 1, wherein said forming the at least one metal containing barrier layer comprises forming the at least one metal containing barrier layer by CVD, PVD or PECVD.

17. The method of claim 1, wherein said forming the homogenous conducting layer comprises forming the homogenous conducting layer by vapor deposition.

18. The method of claim 17, further comprising forming the homogenous conducting layer by CVD, PVD or PECVD.

19. The method of claim 1, wherein said forming the metal containing spacers comprises forming the metal containing spacers by vapor deposition and directional etching.

20. The method of claim 19, further comprising effecting the vapor deposition as CVD, PVD or PECVD.

21. The method of claim 1, wherein removing aligned portions of the second dielectric layer, homogenous conducting layer, and at least one metal containing barrier layer to form the multilayer structure is effected by patterning and etching the second dielectric layer, the homogenous conducting layer, and the at least one metal containing barrier layer.

22. The method of claim 1, wherein said forming the metal containing spacers comprises forming a metal containing spacer layer over the multilayer structure and first dielectric layer and removing portions thereof overlying the first and second dielectric layers.

23. The method of claim 22, wherein said forming the metal containing spacers comprises forming the metal containing spacer layer over the multilayer structure and first dielectric layer by a conformal deposition process.

24. The method of claim 23, wherein portions of the metal containing spacer layer over the multilayer structure and first dielectric layer are removed by etching.

25. The method of claim 1, further comprising removing any remaining portion of the second dielectric layer and upper portions of the metal containing spacers laterally adjacent thereto to expose said homogenous conducting layer.

26. The method of claim 25, further comprising removing any remaining portion of the second dielectric layer and upper portions of the metal containing spacers by etching.

27. A method for constructing a metallization structure for a semiconductor device, comprising:
  providing a substrate having a first dielectric layer underlying at least one metal containing barrier layer;
  creating a homogenous conducting layer directly over the at least one metal containing barrier layer, said homogenous conducting layer comprising at least copper or aluminum and comprising an upper surface, said upper surface of said homogenous conducting layer out of contact with any metal;
  removing aligned portions of the homogenous conducting layer and at least one metal containing barrier layer to form a multilayer structure; and
  flanking at least one surface of the multilayer structure with a metal containing spacer, said metal containing spacer initiating at said at least one metal containing barrier layer and extending to substantially the same height as said homogenous conducting layer.

28. The method of claim 27, further comprising forming a second dielectric layer in contact with said homogenous conducting layer.

29. The method of claim 28, wherein said removing further comprises removing aligned portions of said second dielectric layer to form said multilayered structure.

30. The method of claim 28, wherein said flanking at least one surface of the multilayer structure with a metal containing spacer comprises forming a metal containing spacer layer on said second dielectric layer.

31. The method of claim 30, further comprising removing any remaining portion of the second dielectric layer and upper portions of the metal containing spacer layer laterally adjacent thereto.

32. The method of claim 31, wherein said removing any remaining portion is effected by etching.

33. The method of claim 27, wherein said providing a substrate having a first dielectric layer comprises forming said first dielectric layer of a silicon oxide or BPSG layer.

34. The method of claim 27, wherein said providing a substrate having a first dielectric layer underlying at least one metal containing barrier layer comprises forming the at least one metal containing barrier layer of Ti, Ta, W, Co or Mo or an alloy or a compound of any thereof, including TaN or TiN.

35. The method of claim 34, wherein said forming the at least one metal containing barrier layer comprises forming the at least one metal containing barrier layer of titanium or titanium nitride.

36. The method of claim 27, further comprising forming a second metal containing barrier layer between a first metal containing barrier layer of the at least one metal containing barrier layer and the substrate, said second metal containing barrier layer comprising TiN, TiW, WN, or TaN.

37. The method of claim 27, wherein the at least one metal containing barrier layer is a single metal containing barrier layer and further comprising forming the single metal containing barrier layer of titanium or titanium nitride.

38. The method of claim 27, wherein said creating a homogenous conducting layer comprises creating the homogenous conducting layer of an aluminum-copper alloy.

39. The method of claim 27, wherein said flanking comprises forming the metal containing spacer of at least one layer of Ti, Ta, W, Co or Mo, or alloys thereof or compounds thereof, including TaN and TiN.

40. The method of claim 39, wherein said forming the metal containing spacer comprises forming the metal containing spacers of titanium or titanium nitride.

41. The method of claim 27, wherein said flanking at least one surface comprises forming said metal containing spacer on sidewalls of said multilayer structure.

42. The method of claim 27, wherein said flanking at least one surface comprises forming said metal containing spacer on a top surface of said multilayer structure.

43. The method of claim 27, further comprising forming a second dielectric layer on the homogenous conducting layer to have sidewalls aligned with the conductive layer sidewalls, and forming the metal containing spacer to extend along the sidewalls of the second dielectric layer.

44. The method of claim 43, wherein said forming the second dielectric layer comprises forming the second dielectric layer of a low dielectric constant material.

45. The method of claim 44, wherein said forming the second dielectric layer comprises forming the second dielectric layer of a fluorine-doped silicon oxide.

46. The method of claim 27, further comprising forming the at least One metal containing barrier layer and the metal containing spacer of a same metal.

47. The method of claim 27, wherein said providing a substrate having a first dielectric layer underlying at least one metal containing barrier layer comprises forming the at least one metal containing barrier layer by vapor deposition.

48. The method of claim 47, wherein said forming the at least one metal containing barrier layer by vapor deposition comprises forming the at least one metal containing barrier layer by CVD, PVD or PECVD.

49. The method of claim 27, wherein said creating a homogenous conducting layer comprises forming the homogenous conducting layer by vapor deposition.

50. The method of claim 49, wherein said forming the homogenous conducting layer by vapor deposition comprises forming the homogenous conducting layer by CVD, PVD or PECVD.

51. The method of claim 27, wherein said flanking comprises forming the metal containing spacer by vapor deposition and directional etching.

52. The method of claim 51, further comprising effecting the vapor deposition as CVD, PVD or PECVD.

53. The method of claim 27, wherein removing aligned portions of the homogenous conducting layer and at least one metal containing barrier layer to form a multilayer structure is effected by patterning and etching the homogenous conducting layer and the at least one metal containing barrier layer.

54. The method of claim 27, wherein said flanking comprises forming the metal containing spacer by forming a metal containing spacer layer over the multilayer structure and first dielectric layer and removing portions thereof overlying the first dielectric layer and a top portion of said multilayer structure.

55. The method of claim 54, wherein said forming the metal containing spacer layer over the multilayer structure and first dielectric layer comprises forming the metal containing layer by a conformal deposition process.

56. The method of claim 55, wherein said removing portions of the metal containing spacer layer is effected by etching.

57. A method for making a metallization structure for a semiconductor device, comprising:

forming a substantially planar first dielectric layer on a substrate;

forming at least one metal containing barrier layer over the first dielectric layer;

forming a homogenous conducting layer directly on the at least one metal containing barrier layer;

forming a second dielectric layer in contact with the homogenous conducting layer;

removing aligned portions of the second dielectric layer, the homogenous conducting layer, and the at least one metal containing barrier layer to form a multilayer structure;

forming metal containing spacers on sidewalls of the multilayer structure, said metal containing spacers originating at said at least one metal containing barrier layer; and removing any remaining portion of the second dielectric layer and upper portions of the metal containing spacers laterally adjacent thereto.

58. The method of claim 57, wherein said removing any remaining portion is effected by etching.

59. A method for constructing a metallization structure for a semiconductor device, comprising:

providing a substrate having a first dielectric layer underlying at least one metal containing barrier layer;

creating a homogenous conducting layer directly on the at least one metal containing barrier layer;

forming a second dielectric layer on said homogenous conducting layer;

removing aligned portions of the second dielectric layer, the homogenous conducting layer and the at least one metal containing barrier layer to form a multilayer structure;

flanking at least one surface of the multilayer structure with a metal containing spacer such that said metal containing spacer originates at said at least one metal containing barrier and is substantially the same height as said second dielectric layer; and removing any remaining portion of the second dielectric layer and upper portions of the metal containing spacer layer laterally adjacent thereto.

60. The method of claim 59, wherein said removing any remaining portion is effected by etching.

* * * * *

UNITED STATES PATENT AND TRADEMARK OFFICE
CERTIFICATE OF CORRECTION

PATENT NO. : 6,893,961 B2  Page 1 of 1
APPLICATION NO. : 09/829161
DATED : May 17, 2005
INVENTOR(S) : Akram It is certified that error appears in the above-identified patent and that said Letters Patent is hereby corrected as shown below:

On the Title page, item (57), under "Abstract", in column 2, line 15, delete "metal." and insert -- metal --, therefor.

Column 10, line 34, in Claim 7, delete "aluninum" and insert -- aluminum --, therefor.

Column 12, line 55, in Claim 46, delete "One" and insert -- one --, therefor.

Signed and Sealed this

Eighth Day of April, 2008

JON W. DUDAS
*Director of the United States Patent and Trademark Office*